(12) United States Patent
Cai et al.

(10) Patent No.: US 8,326,591 B1
(45) Date of Patent: Dec. 4, 2012

(54) SYNCHRONIZED ENVELOPE AND TRANSIENT SIMULATION OF CIRCUITS

(75) Inventors: Qian Cai, Stewartsville, NJ (US); Dan Feng, Los Altos, CA (US); Bruce W. McGaughy, Fremont, CA (US); Jun Kong, San Jose, CA (US); Rendong Lin, Fremont, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 879 days.

(21) Appl. No.: 11/941,904

(22) Filed: Nov. 16, 2007

(51) Int. Cl.
 *G06F 17/50* (2006.01)
(52) U.S. Cl. .......................................... 703/13; 703/14
(58) Field of Classification Search .................. 703/13, 703/14
 See application file for complete search history.

(56) References Cited

U.S. PATENT DOCUMENTS

| | | | |
|---|---|---|---|
| 4,792,913 A | | 12/1988 | Buckland et al. |
| 4,985,860 A | * | 1/1991 | Vlach ............................... 703/13 |
| 5,995,733 A | * | 11/1999 | Roychowdhury ............ 716/113 |
| 6,110,217 A | * | 8/2000 | Kazmierski et al. ............. 703/14 |
| 6,374,189 B1 | * | 4/2002 | Sasai ................................ 702/75 |
| 7,493,240 B1 | | 2/2009 | Feng et al. |
| 7,720,660 B2 | * | 5/2010 | Bolcato et al. .................. 703/13 |
| 7,761,279 B1 | | 7/2010 | Cai et al. |
| 2003/0009732 A1 | * | 1/2003 | Gullapalli .......................... 716/6 |

OTHER PUBLICATIONS

Agilent Technologies., Sep. 2004., http://www.ece.uci.edu/eceware/ads_docs/pdf/cktsimenv.pdf, "Circuit Envelope Simulation", i-iv, p. 1-1-1-44, Index-1, Index-2.*

Scheffer, L; Lavagno, L; Martin, G. "EDA for IC Implementaion, Circuit Design, and Process Technology," 2006. pp. 15.8-15.23 CRC Press. Sound Parkway NW.

Cai, Q; "Adaptive Solver for Cyclic Behavior of a Circuit"; U.S. Appl. No. 11/756,410, filed May 31, 2007, 30 pages.

Cai, Q; Partitioning an analog mixed-signal design to perform multi-rate simulation. U.S. Appl. No. 10/857,183, filed May 28, 2004; 62 pages.

Cai, Q. Selecting and using multiple rates during simulation of an analog mixed signal design. U.S. Appl. No. 10/857,265, filed May 28, 2004, 57 pages.

Cai, Q; Analog queue to synchronize a multi-rate simulation of an analog mixed signal design. U.S. Appl. No. 10/858,521, filed May 28, 2004, 38 pages.

Kundert, K.; Clifford, I. "Achieving Accurate Results With a Circuit Simulator", IEE Colloquium on SPICE: Surviving Problems in Circuit Evaluation, 1993, 49 pages.

Kundert, K. "Introduction to RF simulation and its application", Journal of Solid State Circuits, vol. 34, No. 9, Sep. 1999, pp. 1298-1319.

(Continued)

*Primary Examiner* — Eunhee Kim
(74) *Attorney, Agent, or Firm* — Alford Law Group, Inc.; William E. Alford

(57) ABSTRACT

In one embodiment of the invention, a method of simulating a circuit is disclosed including partitioning a circuit into a plurality of blocks, each of the plurality of blocks being radio-frequency blocks or non-radio frequency blocks; performing a first simulation of a first simulation type with the radio-frequency blocks to generate output waveforms of the radio-frequency blocks; performing a second simulation of a second simulation type with the non-radio-frequency blocks to generate output waveforms of the non-radio-frequency blocks where the second simulation type differs from the first simulation type; and synchronizing the first simulation and the second simulation together at one or more time steps to generate output waveforms for the circuit.

29 Claims, 5 Drawing Sheets

OTHER PUBLICATIONS

Agilent Technologies, "Harmonic Balance Simulation", Agilent Technologies, Sep. 2004, 202 pages.

Cadence "Simulating Complex RF/Mixed-Signal Designs Using Virtuoso Ultrasim Ful Chip Simulator", Mar. 23, 2005, 12 pages.

Mei. T. 2006 Robust Envelope and Small-Signal Simulation Algorithms for Oscillatory Systems. Doctoral Thesis. UMI Order No. AAI3243360., University of Minnesota., Dec. 2006, 162 pages.

* cited by examiner

US 8,326,591 B1

SYNCHRONIZED ENVELOPE AND TRANSIENT SIMULATION OF CIRCUITS

FIELD OF INVENTION

The embodiments of the invention generally relate to the simulation of radio frequency (RF) circuits and subcircuits in analog integrated circuit and mixed-signal integrated circuits.

BACKGROUND

One traditional approach to simulating electrical circuits is to use a SPICE (Simulation Program with Integrated Circuit Emphasis) transistor level circuit simulator created by the University of California, Berkeley in 1972, or one of its commercial transistor level circuit simulator variants such as SPECTRE™ by Cadence Design Systems, Inc., HSPICE™ by Synopsis, Inc., or ELDO™ by Mentor Graphics, Corp. A SPICE transistor level circuit simulator assumes that circuit waveforms can be efficiently approximated by low-order piecewise polynomials. The SPICE transistor level circuit simulator formulates a large set of equations representing the entire circuit. Over a small interval of time, the SPICE transistor level circuit simulator solves those equations repeatedly to find segments of the piecewise polynomials.

However, repeatedly solving equations of low-order piecewise polynomials over small time intervals on complex radio frequency (RF) circuits, large analog circuits, or large mixed-signal circuits may generally be slow and tedious in execution and/or exceed the capacity of today's computer systems.

SUMMARY OF INVENTION

The embodiments of the invention are summarized by the claims that follow below.

DETAILED DESCRIPTION

In the following detailed description of the embodiments of the invention, numerous specific details are set forth in order to provide a thorough understanding. However, embodiments of the invention may be practiced without these specific details. In other instances well known methods, procedures, components, and circuits have not been described in detail so as not to unnecessarily obscure aspects of the embodiments of the invention.

INTRODUCTION

A radio frequency (RF) circuit simulator and an analog timing simulator are combined together to form an RF timing simulator. The RF timing simulator can be used to efficiently simulate large RF circuits. The RF timing simulator receives a description of a circuit, partitions the circuit into subcircuits, at least one subcircuit is an RF subcircuit exhibiting highly cyclic behavior, applies RF circuit simulation techniques to the at least one RF subcircuit and traditional transient analysis methods simulate non-RF subcircuits, and coordinates (e.g., synchronizes) the simulation of these subcircuits to efficiently determine the behavior of the overall circuit as a whole.

Figure 1:
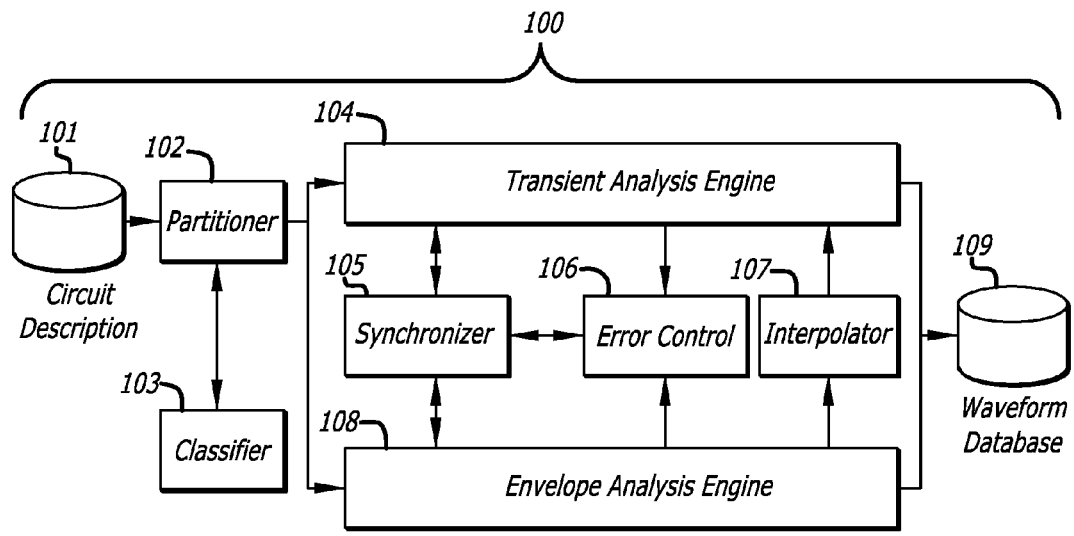
FIG. 1 is a functional block diagram of an RF timing simulator including an envelope analysis engine.

Referring now to FIG. 1, a hierarchical RF mixed-signal simulation system 100 is illustrated. The hierarchical RF mixed-signal simulation system 100 combines the partitioning of large circuits with envelope simulation of subcircuits that operate with RF signals.

The hierarchical RF mixed-signal simulation system 100 receives a circuit description 101 in a database, simulates the circuit (e.g., circuit 200 in FIG. 2A) and generates signal waveforms that are stored in a waveform database 109. The system 100 includes a partitioner 102, a classifier 103, a transient analysis engine 104, a synchronizer 105, an error control block 106, an interpolator 107, and an envelope analysis engine 108, in communication together as shown.

Figure 2A:
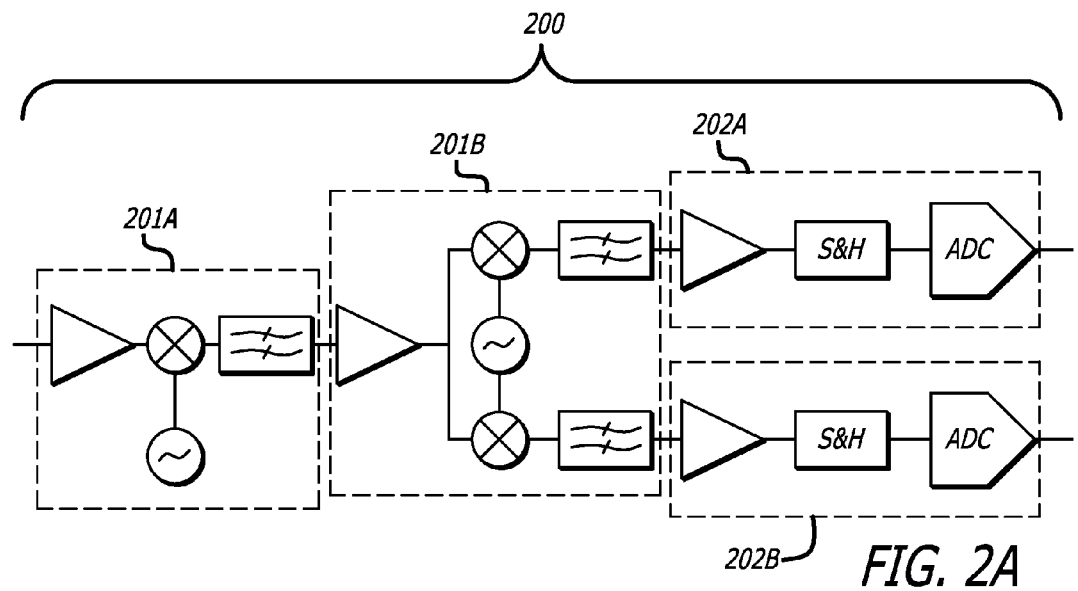
FIG. 2A is a schematic diagram of an exemplary RF circuit that has been partitioned into circuit blocks including one or more RF circuit blocks.

Referring now to FIGS. 1 and 2A, the functions of the system 100 are now briefly described with reference to the mixed signal circuit 200 that processes analog signals and digital signals. The circuit 200 is partitioned into loosely coupled circuit blocks by the partitioner 102. The circuit blocks are then classified as either being RF blocks 201A-201B, if they are expected to contain RF signals, or they are classified as non-RF blocks 202A-202B otherwise.

RF signals are a subset of analog signals. An RF signal has characteristics such that, if coupled to an antenna, an electromagnetic (EM) field is generated that can propagate through space or an electrical current is produced that can be received by a receiver circuit. RF signals are suitable for wireless communications having frequencies that cover a significant portion of the electromagnetic radiation spectrum, extending from nine kilohertz (9 kHz), the lowest allocated wireless communications frequency, to thousands of gigahertz (GHz), referred to herein as RF frequencies.

The classifier 103 classifies the partitioned blocks as being RF blocks or non-RF blocks, automatically based on the type of input stimulus the block receives, or with the help of some manual intervention by the user. If the input stimulus is an analog signal without an RF frequency, the block may be classified as a non-RF block. Alternatively, if the input stimulus is an analog signal with an RF frequency, the block may be classified as an RF block. A digital circuit block, as its name implies, receives a digital signal as an input stimulus and generates a digital output signal. Accordingly, a digital circuit block on an integrated circuit design may also be classified as a non-RF block.

Figure 2B:
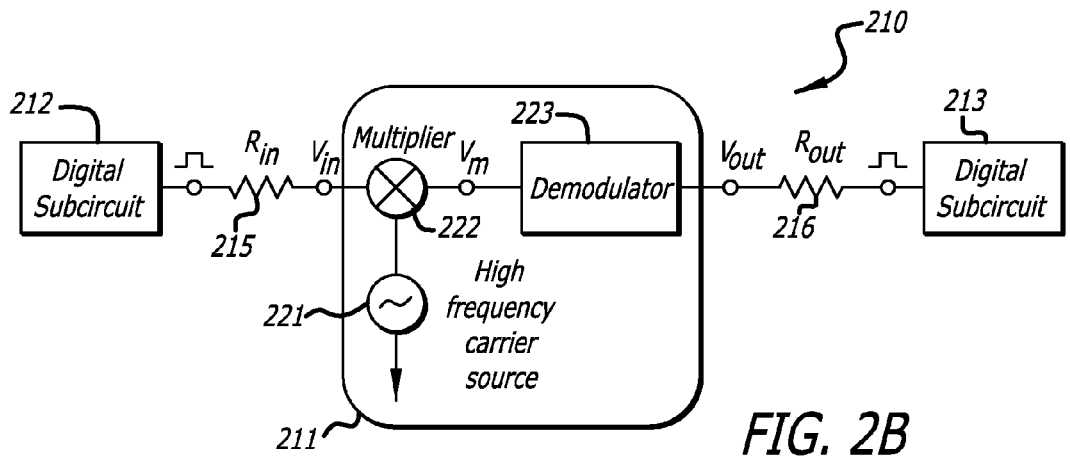
FIG. 2B is an exemplary block diagram of a circuit partitioned into digital sub-circuits and RF subcircuits.

Referring momentarily to FIG. 2B, a circuit 210 may be partitioned into RF circuit blocks 211 and digital circuit blocks 212-213 coupled together as shown. An input resistor Rin 215 and an output resistor Rout 216 may be used to match the impedance of the input and output ports of the RF circuit blocks 211 with the impedances of the respective ports of the digital circuit blocks 212-213. An exemplary RF circuit block may include a voltage controlled oscillator 221 to generate a carrier signal, a mixer or multiplier 222 to modulate the input signal Vin, and a demodulator 223 to recover a modulated signal for the output signal Vout. Some processing may occur on the modulated signal Vm generated by the mixer 222 within the RF subcircuit 211.

Figure 2C:
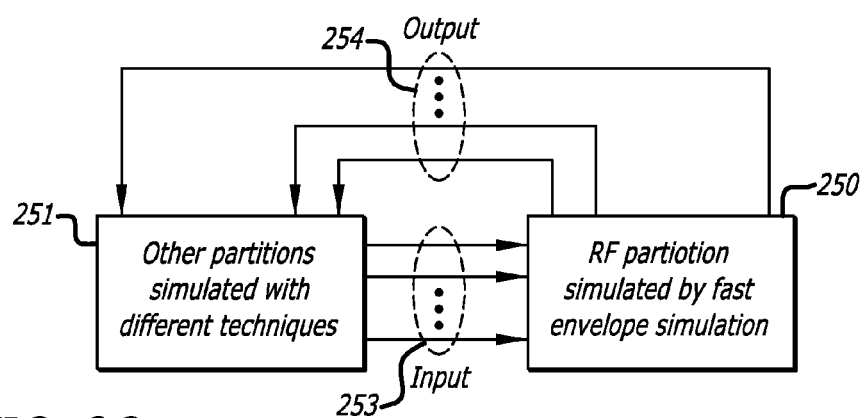
FIG. 2C is a block diagram of a circuit partitioned into an RF partition for simulation by a first type of simulation and other partitions for simulation by different types of simulation.

Referring momentarily to FIG. 2C, a circuit can generally be viewed as having RF partitions 250 with one or more input ports 253 coupled to the respective one or more output ports of other partitions 251 and one or more output ports 254 respectively coupled to one or more input ports of the other partitions 251. The RF partitions 250 may be simulated with a first simulation of a first simulation type to generate output waveforms of each of the radio-frequency partitions or blocks 250. The other partitions 251, non-radio-frequency partitions or blocks, may be simulated with different simulation methods or techniques. For example, a non-radio-frequency block may be have a second simulation of a second simulation type performed upon it to generate output waveforms of the non-radio-frequency block in which the second simulation type differs from the first simulation type.

Envelope simulation is performed locally in the RF partitions (e.g., RF circuit blocks 201A-201B) by the envelope analysis engine 108. Local envelope simulation significantly reduces the circuit equation size to be solved by the envelope analysis engine and may increase the simulation speed of an entire circuit. Envelope simulation may also significantly reduce the memory space use for circuit simulation.

Transient simulations are carried out for other circuit blocks (e.g., non-RF circuit blocks 202A-202B) of the circuit in the transient analysis engine 104 to determine there output signals in response to input signals.

Envelope simulation, in the RF partitions or RF blocks performed by the envelope analysis engine 108, is synchronized with transient simulations performed by the transient analysis engine 104 in other blocks, at each desired time step to assure the solution accuracy. The synchronizer 105, with guidance from the error controller block 106, periodically synchronizes the envelope analysis engine 108 and the transient analysis engine 104 together to synchronize the transient simulations with the envelope simulations.

The error controller block 106 is used to control simulation error to assure the accuracy of the simulation results. The error controller block 106 performs smoothness checking to determine if an envelope simulation is valid or not. Moreover, the error controller block 106 may cause the system to adaptively switch from envelope simulation to transient simulation of an RF block in response to the smoothness checking. The error controller block 106 further performs local truncation error (LTE) checking on all harmonics used in envelope simulation to be sure transients are settled before switching back to envelope simulation from transient simulation.

To complete an analysis of a circuit, envelope simulation of an RF block may be coupled to transient simulations of non-RF blocks at synchronization points. However, envelope simulation may skip cycles and solutions of the input and output signals of an RF block or RF partition at the synchronization points. Trigonometric interpolation is performed by the interpolator 107 on the results of the envelope simulation to obtain the solutions of the input and output ports of the RF blocks (e.g. RF blocks 201A-201B) at the synchronization time points that are used by the transient analysis engine but skipped by envelope simulation.

Envelope Simulation

Figure 3:
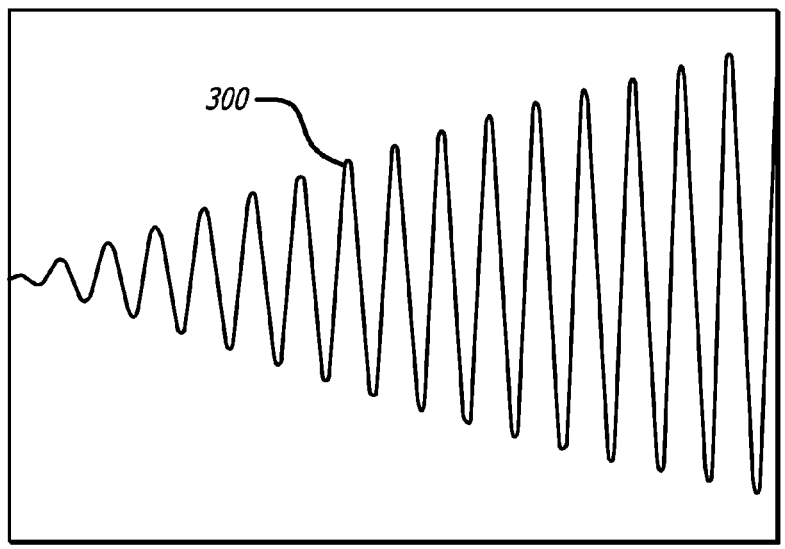
FIG. 3 is a waveform diagram of a highly cyclic signal such as generated by a circuit that is a good candidate for envelope simulation.

Referring now to FIG. 3, envelope simulation is performed by the envelope analysis engine 108. Envelope simulation assumes that signals present in a circuit are slowly varying highly cyclic signals, such as signal 300 shown in FIG. 3 that may be referred to as being an envelope signal. Notice that this signal is highly repetitive with one parameter, or at most a small number of parameters, that change slowly relative to the speed of the repetitive variation. In the envelope signal 300 illustrated in FIG. 3, the amplitude is slowly varying. In other slowly varying highly cyclic signals, the offset, the phase, the frequency, or the amplitude and phase of any of the harmonics may slowly change relative to the repetitive variation.

Traditional methods of envelope simulation are described in "Introduction to RF Simulation and Its Application" by Kundert, K. S., *IEEE J. Solid-State Circuits*, Vol. 34, September 1999, pp. 1298-1319. The analysis performed by traditional methods of envelope simulation may be referred to as transient-envelope analysis. Traditional methods of envelope simulation include a transient-envelope analysis based on shooting methods and a transient-envelope analysis based on harmonic balance. Alternatively, fast envelope simulation methods such as those described in U.S. patent application Ser. No. 11/756,410, entitled ADAPTIVE SOLVER FOR CYCLIC BEHAVIOR OF A CIRCUIT, filed by Yang and Cai, on May 31, 2007 which is incorporated herein by reference, may be used to perform envelope simulation. Envelope simulation further includes a transient-envelope analysis based on newton-shooting methods.

Timing Simulation

SPICE-like transistor level circuit simulators employ very detailed and accurate compact nonlinear device models and solve the entire circuit as a whole on every timestep. They provide accurate results very reliably and are suitable for analog and mixed-signal simulation of circuits up to moderate size. SPECTRE™ transistor level circuit simulator licensed by Cadence Design Systems, Inc. is a typical SPICE-like transistor level circuit simulator. With very large-scale integrated (VLSI) circuits, conventional SPICE-like simulation tools may encounter speed and capacity problems. Analog timing simulators were introduced to simulate larger integrated circuits in a more efficient way.

Analog timing simulators, such as ULTRASIM™ timing simulator licensed by Cadence Design System, Inc., applies partitioning, event driven simulation, multi-rate simulation, and simplification of device models to overcome the speed and capacity problems of conventional SPICE-like transistor level circuit simulators. Among these techniques, partitioning is helpful in solving speed and capacity problems. Partitioning divides a large design into many small partitions that can be solved separately during simulation. With partitioning, a simulator is free to allocate resources to each partition based on the activity in that partition. Since many partitions may be inactive much of the time, the time to complete a simulation of an integrated circuit may be significantly reduced.

Partitioning

Before partitioning a circuit, the circuit is analyzed to determine areas of strong and weak coupling. If blocks of circuitry can be identified where all signals entering and leaving are strongly unidirectional, then the block would be considered a partition. There are two types of unidirectional signals: inputs and outputs. With inputs, the signal entering the block is largely determined by circuitry outside the block and is only weakly affected by the block itself. The signal on outputs is largely determined by the circuitry within the block and largely unaffected by circuitry outside the block.

Figure 4:
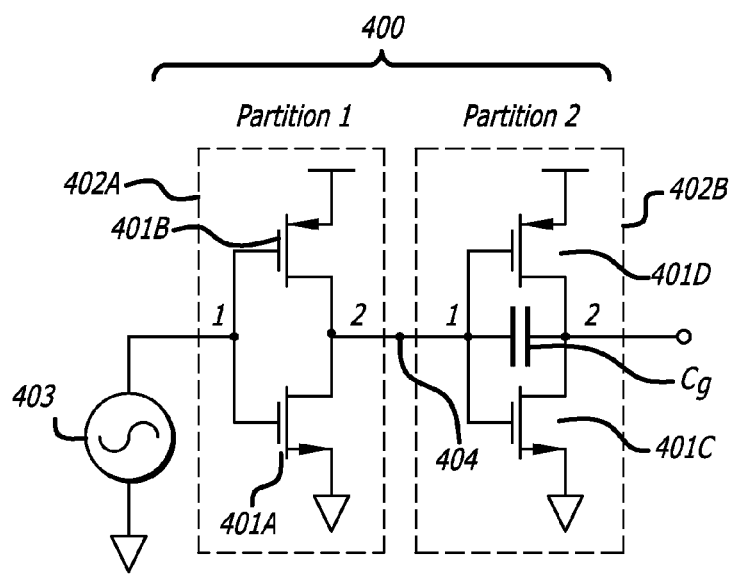
FIG. 4 is a schematic diagram of a simple circuit partitioned into two circuit blocks loosely coupled together.

Referring now to FIG. 4, an exemplary circuit 400 is illustrated. The partitioner 102 may partition the circuit 400 into partitions 402A and 402B. That is, the four transistors 401A-401D of the circuit 400 may be divided into two partitions 402A-402B. In each partition 402A-402B, pin 1 represents an input and pin 2 represents an output. An intermediate node (int) 404 couples the output of partition 402A to the input of partition 402B. An input source 403 is coupled to the input of the first partition 402A. The output of the first partition 402A is coupled to the input of the second partition 402B. The output of the second partition 402B may couple to other circuits in other partitions.

When a signal changes its value, the partitions that have inputs directly connected to the signal are evaluated by simulation. If an output signal of a partition changes, then any partitions that are driven by that output would also be evaluated, and so on. In FIG. 4, partition 402A is evaluated whenever the signal produced by the input source 403 changes, and then partition 402B is evaluated if the output of partition 402A changes significantly.

There is more than one way to partition a circuit. For example, in FIG. 4 the two partitions could be combined into a single partition. For efficiency, it is desirable to have a greater number of partitions, each of which may be relatively small. However, being too aggressive at partitioning can result in a simulator producing inaccurate results. For example, in FIG. 4 consider a gate capacitor Cg coupling from the output of the second partition 402B to the output of the first partition 402A. If simulation are run separately on the partitions 402A-402B, the effects of the gate capacitor Cg on the output of the first partition 402A may not included in the simulation of the first partition 402A. If the effects of the gate capacitor Cg on the output of the first partition 402A were to have a significant effect, the overall results of the simulation of the circuit 400 may be inaccurate.

There are a number of ways to partition a circuit. One method of partitioning a circuit is to use the structure of the circuit as specified by the user. Generally, the circuit is specified by a user using a hierarchical structure.

Figure 5:
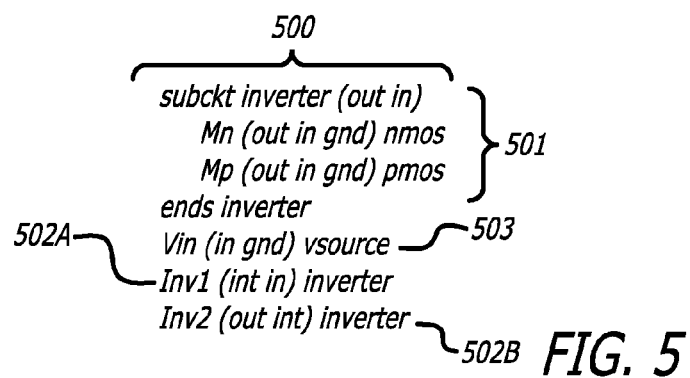
FIG. 5 is a SPICE netlist circuit description of the circuit schematically illustrated in FIG. 4.

Referring now to FIG. 5, an exemplary netlist 500 specified by a user may be used to partition the exemplary circuit 400 of FIG. 4. The netlist 500 includes a subcircuit definition (inverter 501), and two instances of a subcircuit, Inv1 502A and Inv2 502A respectively corresponding to the partitions 402A and 402B of FIG. 4. The netlist 500 further includes a voltage source Vin, corresponding to the voltage source 403, coupled to the input in of the subcircuit Inv1 502A. A node int couples the output of the subcircuit Inv1 502A to the input of the subcircuit Inv2 502B that corresponds to the node 404 shown in FIG. 4.

Partitioning a circuit in accordance with the netlist considers blocks of circuitry that are grouped into subcircuits in the netlist as a partition. However, there may be subcircuits in the netlist that could be further partitioned into yet smaller circuit partitions. These smaller partitions may be overlooked if the netlist structure is used in circuit partitioning. Moreover, a flattened circuit netlist with no hierarchy provides little guidance in partitioning a circuit as there are no subcircuits. A flattened circuit netlist is a common when the circuit has been automatically extracted from a layout.

Another approach to partitioning a circuit is to ignore the structure of the netlist and identify potential partitions using heuristics that are based on the fundamental nature of each of its components. This approach is followed by some embodiments of the invention. Automatic partitioning may be carried out according to the rules and algorithms of U.S. patent application Ser. No. 11/390,574 entitled METHOD AND SYSTEM FOR PARTITIONING INTEGRATED CIRCUITS filed by Bruce McGaughy et al. on Mar. 27, 2006, which is incorporated herein by reference. However, other embodiments of the invention allow a user to specify information about the circuit according to the structure present in the netlist. The information provided by a user may be used to affect either the partitioning or how the partitions are used.

In the embodiments of the invention, any subcircuit definition or subcircuit instance can be designated for envelope simulation. If a subcircuit definition is specified for envelope simulation, then any subcircuits that are instances of this definition will be simulated by envelope simulation with the same simulation options. For most efficient results the RF blocks with a high frequency carrier modulated by a low frequency baseband signal should be specified for envelope simulation. Since the subcircuits are often different than the partitions, when a subcircuit is specified for envelope simulation, some adjacent subcircuits may also be combined to form a partition for envelope simulation due to a strong coupling with the specified subcircuit.

Simulation Synchronization

In the embodiments of the invention, different simulation algorithms may be employed for each partition. For example, conventional transient analysis may be performed on partitions that do not contain RF signals while an envelope analysis may be performed on those partitions that include RF signals. Each partition has its own rate at which it operates and its own level of activity. Additionally, each simulation algorithm has its own way of progressing through time. Conventional transient algorithms tend to follow the basic signal whereas envelope algorithms must account for the rapid rate of the carrier and the slow variations of the envelope. Since different partitions may be simulated by different techniques in partitioned RF simulation, synchronization plays an important role in accuracy and efficiency. A robust synchronization scheme is critical to partitioned RF mixed-signal simulation. If the envelope simulation cannot be correctly synchronized with other simulation, not only the solution accuracy but also the simulation efficiency will be affected. In the embodiments of the invention, trigonometric interpolation and a smoothness checking scheme are used in synchronization by the synchronizer 105.

Trigonometric Interpolation

RF envelope simulation gets its efficiency by not evaluating every cycle of a cyclic waveform. That is, envelope simulation skips cycles of the cyclic waveform. In the embodiments of the invention, the RF partitions run ahead of the other partitions, meaning that an RF partition will simulate out in time first, and the other partitions will simulate to catch up. Once they catch up, the simulation of the RF partition begins again. During the simulation of an RF partition or RF block, envelope simulation will routinely skip many cycles. However as the other adjacent partitions catch up, the solutions at the time points skipped by envelope simulation may be desired for synchronization. Because of the characteristics of the modulated waveforms present in the partitions undergoing envelope simulation, accurate values of signals at the desired time points may be obtained by interpolation of the results of the envelope simulation. Since the modulated waveforms are nearly periodic over a certain time interval, a trigonometric interpolation scheme may be used to obtain the solutions for signals of the input and output ports at the missing time points. The trigonometric interpolation models a signal over one cycle using a Fourier series, and then models the modulation of the signal into other cycles of the signal by using slowly time-varying Fourier coefficients.

To perform interpolation, the envelope algorithm computes the Fourier coefficients for each input signal and each output signal at the beginning and ending of its step, such as at $t_1$ and $t_2$. The Fourier coefficients at times at $t_1$ and $t_2$ are $V_k^{t_1}$ ($V_k(t_1)$) and $V_k^{t_2}$ ($V_k(t_2)$) respectively, where $k=-K, \ldots, K$. The interpolation of results of envelope simulation to obtain solutions of signals consists of two steps. The first step is to obtain the Fourier coefficients at the desired point by linear interpolation. The second step is to obtain the solution of a signal at the desired time through trigonometric interpolation using the Fourier coefficients values obtained in the first step.

Let us consider the signals expressed by equation (1) as follows:

$$v(t) = \sum_{k=-K}^{K} V_k(t) e^{j2\pi k f t} \quad (1)$$

where $i=\sqrt{-1}$ and $V_k^{t_1}$ and $V_k^{t_2}$ are the Fourier coefficients respectively obtained at the time $t_1$ (the previous envelope simulation period) and time $t_2$ (the current envelope simulation period). The Fourier coefficients at the desired point t, where $t_1 < t < t_2$, are obtained by evaluating equation (2) as follows:

$$V_k(t) \approx V_k(t_1) + \frac{V_k(t_2) - V_k(t_1)}{t_2 - t_1}(t - t_1) \quad (2)$$

With the Fourier coefficients $V_k(t)$ determined from evaluating equation (2), the signal values v(t) at the desired time point t can be evaluated by solving equation (1).

Synchronization Procedure

In the embodiments of the invention, the envelope simulation in the RF partition is usually ahead of other partitions. The signal values of the input and output ports at the synchronization time points are obtained by interpolation described herein if they are skipped by envelope simulation. Synchronization between the RE partition and other partitions is carried out using a smoothness checking and resolving technique as described herein and also in U.S. Pat. No. 7,761,279 entitled SYNCHRONIZED TRANSIENT-ENVELOPE AND EVENT-DRIVEN SIMULATION OF ELECTRONIC CIRCUITS filed on Nov. 16, 2007 by inventors Qian Cai et al. and issued on Jul. 20, 2010, which is incorporated herein by reference.

Assume that there are K input ports in the RF partition of a circuit and that their state variables are represented by $v_1, v_2, \ldots, v_K$. We can check their smoothness by comparing their time derivatives at previous and current time points. Let $t_a$ be the last accepted time point and $t_c$ be the current synchronization time point and we compute changes in the state variables by equations (4) and (5) as follows:

$$\Delta v_i' = \left| \frac{dv_i}{dt}\bigg|_{t_c} - \frac{dv_i}{dt}\bigg|_{t_a} \right| \; i=1,2,\ldots,K \quad (4)$$

$$\Delta v_i = |v_i(t_c) - v_i(t_a)| \; i=1,2,\ldots,K \quad (5)$$

Let $\epsilon'$ and $\epsilon$ be the tolerances allowed for smoothness checking such that we define a smooth waveform (SW) as equation (6) as follows:

$$SW_i = \Delta v_i < \epsilon \text{ and } \Delta v_i' < \epsilon' \; i=1,2,\ldots,K \quad (6)$$

That is, if the change in state variables computed by equations (4) and (5) are within predetermined levels of tolerance, the input waveform at the current synchronization time point $t_c$ is a smooth waveform. If $SW_i$ for all $i=1,2,\ldots,K$ are true smoothness checking successes, meaning that changes in other partitions will not affect the input signals on the input ports of the given RF block or partition, the current fast envelope simulation solution is valid and the process can proceed to the next synchronization time point. If the smoothness checking fails, it indicates that changes in another partition causes big signal changes in the input ports of the given RF block and thus, the current fast envelope simulation solution is not valid. With the current fast envelope simulation solution being invalid, the RF block is re-simulated by transient simulation methods to obtain correct results for its output waveforms.

Synchronization Process

The synchronization procedure consists of three main techniques: trigonometric interpolation, smoothness checking, and adaptive switching between normal transient simulation and fast envelope simulation. Trigonometric interpolation is used to obtain the solution of the RF partitions at the time points skipped by fast envelope simulation. Smoothness checking is applied to check the signal changes in the input ports of the RF partitions to validate the correctness of current fast envelope solutions. Adaptive switching between normal transient simulation and fast envelope simulation is utilized to assure the simulation accuracy with fast computational speed and is further described in U.S. Pat. No. 7,761,279 entitled SYNCHRONIZED TRANSIENT-ENVELOPE AND EVENT-DRIVEN SIMULATION OF ELECTRONIC CIRCUITS filed on Nov. 16, 2007 by inventors Qian Cai et al. and issued on Jul. 20 2010, which is incorporated herein by reference.

Figure 6:
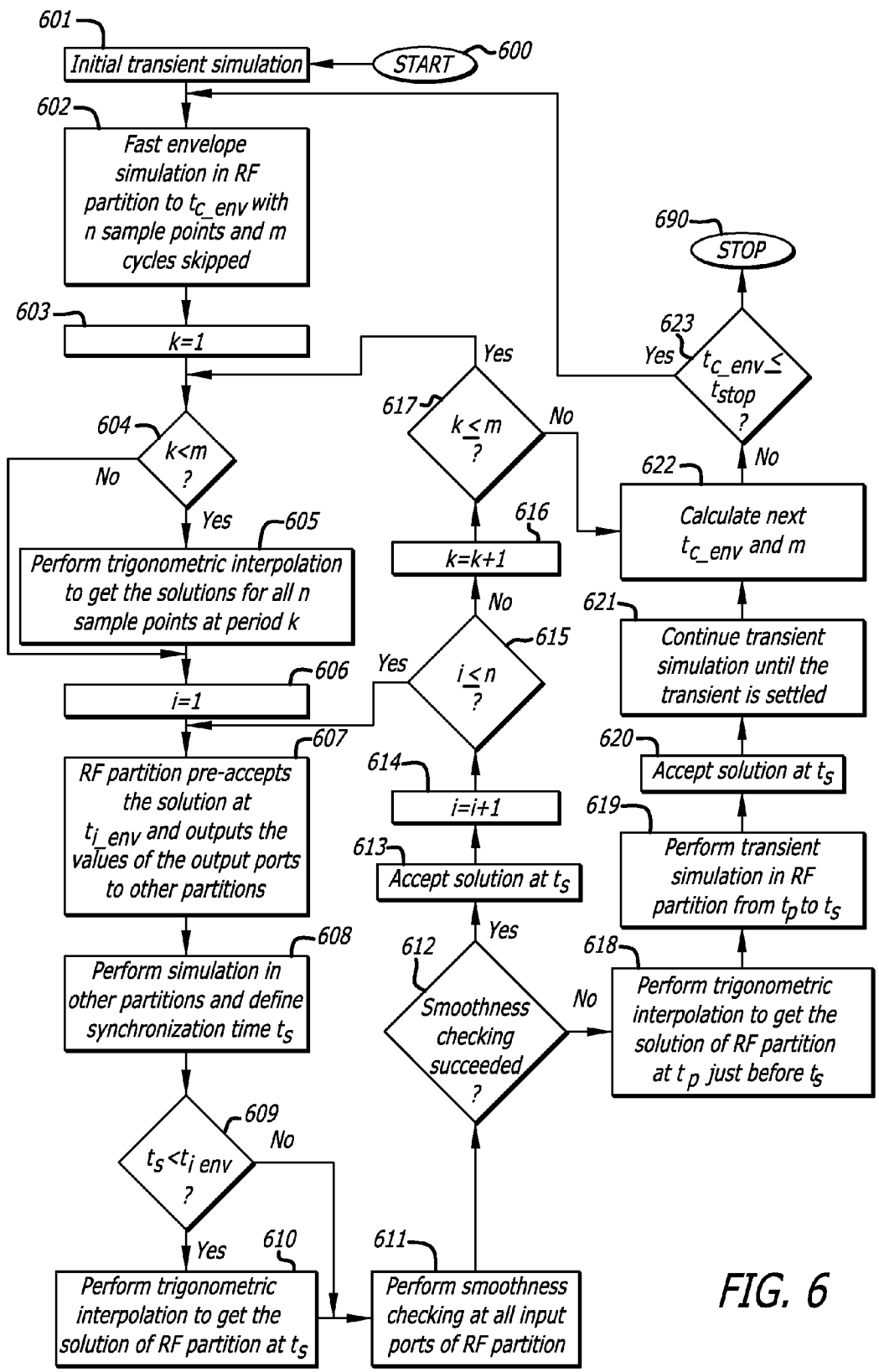
FIG. 6 is an exemplary flow chart diagram of performing RF timing analysis on an RF circuit with an RF timing simulator including an envelope analysis engine.

FIG. 6 illustrates a flow diagram of the synchronization process. The process begins at the start block 600 and goes to process block 601.

At process block 601, an initial transient simulation is performed on all the partitions up to an envelope time start env_tstart (either specified by the user or 3 clock cycles by default) or until time $t_e$ when a transient is settled, whichever time is greater. Local truncation error (LTE) checking on all harmonics used in fast envelope simulation is performed to make sure the transient is settled.

The number of cycles (m) that can be skipped is calculated according to the LTE of all harmonics being used for fast envelope simulation. The ending time point $t_{c\_env}$ of the current fast envelope simulation period is also computed.

At process block 602, a fast envelope simulation is performed in the RF partitions at the current period with n sample points and m cycles being skipped.

Over process blocks 603-604, synchronization is started for the period k, $1 \leq k \leq m$. At process 603, the variable k is initialized to the value of one. At process 604, a determination is made whether or not the variable k is less than the m number of cycles being skipped. If not, the process skips block 603 and goes to block 606. If so, the process goes to block 606.

At process block 603, a trigonometric interpolation is performed to obtain the solution for the n sample points that were skipped in the time period k if the time period k is not greater than or equal to the m number of cycles being skipped.

The process starts synchronization for time point $t_{i\_env}$, $1 \leq i \leq n$, in period k. At block 606, the variable i is initialized to a value of one. At block 615, a determination is made whether or not the variable i is less than or equal to the number of n sample points that were skipped.

At process block 607, a solution 604 at $t_{i\_env}$ for a first partition is pre-accepted and the solution at the output ports of the RF partition are provided to other partitions to synchronize the entire circuit.

At process block 608, simulations on other partitions in a circuit are performed and a synchronization time point $t_s(t_s < t_{i\_env})$ is defined for the entire circuit.

At process block 609, a determination is made if $t_s < t_{i\_env}$. If so, the process goes to block 610. If not, block 610 is skipped and the process goes to process block 611.

At block 610, trigonometric interpolation is performed to obtain a solution for the RF partition at time point $t_s$. The process then goes to block 611.

At block 611, a smoothness checking at all the input ports to an RF partition is performed. The process then goes to block 612.

At block 612, a determination is made as to whether or not the smoothness checking succeeded at process block 611. If not, block 618 is performed next. If so, the process goes to process block 613.

At block 613, the solution for the RF partition at time point $t_s$ is accepted and the process goes to block 614.

At block 614, the variable i is incremented by one and the process then goes to block 615.

At block 615, a determination is made as to whether or not the variable i is less than or equal to the number of n sample points that were skipped. If i is greater than the number of n sample points, the process goes to block 616. If i is less than or equal to the number of n sample points the process goes to block 607 to repeat block 607 so that the RF partition is processed for each sample point skipped.

At block 616, the variable k is incremented by one. The process then goes to block 617.

At block 617, a determination is made as to whether or not the variable k is less than or equal to the m number of cycles being skipped. If the variable k is less than or equal to m, the process goes to block 604 and repeats a loop. If the variable k is greater than m, the process goes to block 622.

At block 622, the process incremented to make calculations at the next envelope time where m cycles are to be skipped and the process goes to block 623.

At block 623, a determination is made as to whether or not the ending time point $t_{c\_env}$ is less than or equal to a stop time $t_{stop}$. If so, the process goes to block 602 and repeats a loop for the next RF partition? If the ending time point $t_{c\_env}$ is greater than the stop time $t_{stop}$, the process goes to block 690 and stops. This is so the process continues until $t_{c\_env}$ reaches $t_{stop}$.

If it was determined at block 612 that smoothness checking failed, the process block 618 is performed.

At block 618, a trigonometric interpolation is performed to get a solution of the RF partition at the time point $t_p$ just before the synchronization time $t_s$. The process then goes to block 619.

At block 619, a transient simulation in the RF partition is performed from time $t_p$ to the synchronization time $t_s$. The process then goes to block 620.

At block 620, the solution at the synchronization time $t_s$ is accepted. The process then goes to block 621.

At block 621, the transient simulation of the RF partition begun in process block 619 is continued in all the partitions until the transient is settled in the RF partition. The process block then goes to block 622.

The process blocks 622 and 623 were previously described. At block 622, as previously described, the process incremented to make calculations at the next envelope time where m cycles are to be skipped and the process goes to block 623. At block 623, a determination is made as to whether or not the ending time point $t_{c\_env}$ is less than or equal to a stop time $t_{stop}$. If so, the process goes to block 602 and repeats a loop for the next RF partition? If the ending time point $t_{c\_env}$ is greater than the stop time $t_{stop}$, the process goes to block 690 and stops.

Computer System for Use with RF Timing Analysis

Figure 7:
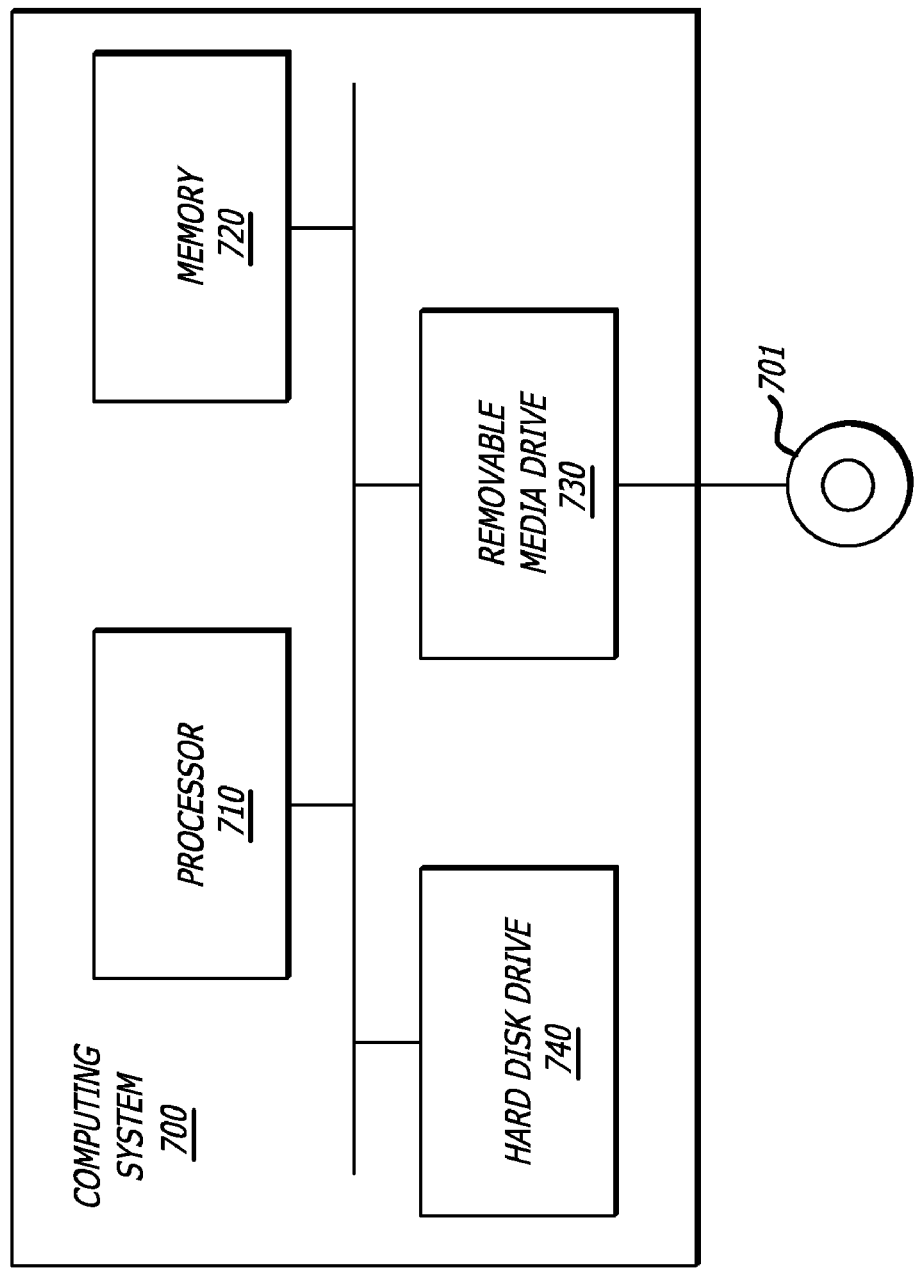
FIG. 7 is a functional block diagram illustrating an exemplary computer system that may be used to perform some or all of the processes in accordance with a number of embodiments of the invention.

Referring now to FIG. 7, a computing system 700 is illustrated that may be used to perform some or all of the processes in accordance with a number of embodiments of the invention. In one embodiment of the invention, the computing system 700 includes a processor 710, a memory 720, a removable media drive 730, and a hard disk drive 740. In one embodiment, the processor 710 executes instructions residing on a machine-readable medium, such as the hard disk drive 740, a removable medium 701 (e.g., an optical medium (compact disk (CD), digital video disk (DVD), etc.), a magnetic medium (magnetic disk, a magnetic tape, etc.), or a combination of both. The instructions may be loaded from the machine-readable medium into the memory 720, which may include Random Access Memory (RAM), dynamic RAM (DRAM), etc. The processor 710 may retrieve the instructions from the memory 720 and execute the instructions to perform the operations described above.

Note that any or all of the components and the associated hardware illustrated in FIG. 7 may be used in various embodiments of the system 700. However, it should be appreciated that other configurations of the system 700 may include more or less devices than those shown in FIG. 7.

Some portions of the preceding detailed description have been presented in terms of algorithms and symbolic representations of operations on data bits within a computer memory. These algorithmic descriptions and representations are the tools used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be kept in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The embodiments of the invention also relates to an apparatus for performing the operations described herein. This apparatus may be specially constructed for the desired purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The processes and displays presented herein are not inherently related to any particular computer or other apparatus. Various general-purpose systems may be used with programs in accordance with the teachings herein, or it may prove convenient to construct a more specialized apparatus to perform the operations described. The desired structure for a variety of these systems will appear from the description below. In addition, the embodiments of the invention are not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

CONCLUSION

The RF timing simulator has the capacity and speed to simulate large RF circuits at the transistor level. The RF timing simulator partitions the circuit into loosely coupled blocks, identifies the functional properties of the blocks, and then simulates those blocks using suitable techniques according to the functional properties of the blocks. The RF timing simulator may apply either traditional transient analysis methods, such as found in SPICE, or special RF simulation methods such as envelope analysis. By partitioning circuits into loosely coupled blocks and applying RF simulation methods to RF circuit blocks, the RF timing simulator may efficiently simulate large RF circuits.

When implemented in software, the elements of the embodiments of the invention are essentially the code segments to perform the necessary tasks. The program or code segments can be stored in a processor readable medium or transmitted by a computer data signal embodied in a carrier wave over a transmission medium or communication link. The "processor readable medium" may include any medium that can store or transfer information. Examples of the processor readable medium include an electronic circuit, a semiconductor memory device, a read only memory (ROM), a flash memory, an erasable programmable read only memory (EPROM), a floppy diskette, a CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via computer networks such as the Internet, Intranet, etc.

The embodiments of the invention are thus described. While embodiments of the invention have been particularly described, it is to be understood that such embodiments are merely illustrative of and not restrictive on the broad invention, and that the embodiments of the invention not be limited to the specific constructions and arrangements shown and described. Instead, the embodiments of the invention should be construed according to the claims that follow below.

What is claimed is:

1. A method of simulating a circuit comprising:
   partitioning a circuit into a plurality of blocks, each of the plurality of blocks being radio-frequency blocks or non-radio frequency blocks;
   performing a first envelope simulation of the radio-frequency blocks to generate output waveforms of the radio-frequency blocks;
   performing a second simulation of a second simulation type with the non-radio-frequency blocks to generate output waveforms of the non-radio-frequency blocks, the second simulation differing from the first envelope simulation; and
   synchronizing the first envelope simulation of the radio-frequency blocks and the second simulation of the non-radio frequency blocks together at one or more time steps to generate output waveforms for the circuit.

2. The method of claim 1, wherein
   a radio frequency block has a radio frequency signal as its input stimulus.

3. The method of claim 1, wherein
   one or more signals present in a radio-frequency block are slowly varying highly cyclic signals.

4. The method of claim 1, further comprising:
   interpolating results of the first envelope simulation to determine a solution for input and output signals of the radio-frequency block at a time step to synchronize the first envelope simulation and the second simulation together.

5. The method of claim 4, wherein
   the second simulation is a transient simulation,
   the envelope simulation skips one or more cycles of its input and output signals, including the solution of the input and output signals at the time step to synchronize the envelope simulation and the transient simulation together, and
   the interpolating is a trigonometric interpolation that models a signal over one cycle of a cyclic waveform using a Fourier series and models the modulation of the signal into other cycles of the cyclic waveform of the signal using slowly time-varying Fourier coefficients.

6. The method of claim 1, wherein
   at least one non-radio-frequency block is a digital circuit block.

7. The method of claim 1, further comprising:
   storing the output waveforms for the circuit in a waveform database.

8. The method of claim 7, further comprising:
   prior to the synchronizing, storing the output waveforms of the radio-frequency blocks in the waveform database.

9. A computer program product for simulation of a circuit, comprising:
   a non-transitory computer readable storage medium having
      computer readable program code embodied therein to partition a circuit into a plurality of circuit blocks, the plurality of circuit blocks including radio frequency circuit blocks and non-radio-frequency blocks;
      computer readable program code embodied therein to perform envelope simulation with radio-frequency circuit blocks;
      computer readable program code embodied therein to perform transient simulation with non-radio-frequency circuit blocks; and
      computer readable program code embodied therein to synchronize the envelope simulation of the radio frequency circuit blocks and the transient simulation of the non-radio frequency circuit blocks together at one or more time steps to form a simulation output for the circuit.

10. The computer program product of claim 9, wherein the non-transitory computer readable storage medium further having
computer readable program code embodied therein to interpolate results of the envelope simulation to obtain one or more simulation solutions for the radio-frequency circuit blocks at one or more time points skipped over by the envelope simulation.

11. The computer program product of claim 9, wherein the non-transitory computer readable storage medium further having
computer readable program code embodied therein to adaptively switch between envelope simulation and transient simulation of a radio-frequency circuit block and compare results of the envelope simulation and the transient simulation to determine simulation accuracy.

12. The computer program product of claim 9, wherein the envelope simulation is a fast envelope simulation; and the non-transitory computer readable storage medium further has
computer readable program code embodied therein to check smoothness of input signal changes to the radio-frequency blocks to determine if fast envelope simulation of the radio-frequency circuit blocks is valid, and if the fast envelope simulation of a radio-frequency circuit block is invalid then the radio-frequency block is re-simulated with a different simulation method.

13. The computer program product of claim 12, wherein the different simulation method to re-simulate the radio-frequency circuit block is transient simulation.

14. The computer program product of claim 9, wherein at least one non-radio-frequency circuit block is a digital circuit block.

15. The computer program product of claim 9, wherein the simulation output for the circuit are output waveforms and the non-transitory computer readable storage medium further has
computer readable program code embodied therein to store the output waveforms for the circuit in a waveform database.

16. The computer program product of claim 15, wherein the envelope simulation generates output waveforms for the radio-frequency circuit blocks and the non-transitory computer readable storage medium further has
computer readable program code embodied therein to store the output waveforms for the radio-frequency circuit blocks in the waveform database.

17. A simulation system to simulate a design of an integrated circuit including radio-frequency (RF) blocks, the simulation system comprising:
a computing device including
a partitioner to partition the integrated circuit into partitioned circuit blocks including RF blocks and non-RF blocks;
a transient analysis engine in communication with the partitioner, the transient analysis engine to perform transient simulations of the non-RF blocks;
an envelope analysis engine in communication with the partitioner, the envelope analysis engine to perform envelope simulations of the RF blocks; and
a synchronizer in communication with the transient analysis engine and the envelope analysis engine, the synchronizer to periodically synchronize the envelope analysis engine and the transient analysis engine together to synchronize the transient simulations of the non-RF blocks with the envelope simulations of the RF blocks.

18. The simulation system of claim 17, wherein the computing device further includes:
an interpolator in communication with the transient analysis engine and the envelope analysis engine, the interpolator to interpolate results of the envelope simulation by the envelope analysis engine for the transient analysis engine.

19. The simulation system of claim 18, wherein the computing device further includes:
an error controller in communication with the transient analysis engine, the envelope analysis engine, and the synchronizer, the error controller to further synchronize the transient analysis engine and the envelope analysis engine together and control simulation error to provide simulation results.

20. The simulation system of claim 19, wherein the error controller further to perform local truncation error (LTE) checking on all harmonics used in envelope simulation to be sure transients are settled.

21. The simulation system of claim 18, wherein the interpolator uses trigonometric interpolation to model a signal over one cycle of a cyclic waveform using a Fourier series and models the modulation of the signal into other cycles of the cyclic waveform of the signal using slowly time-varying Fourier coefficients.

22. The simulation system of claim 19, wherein the computing device further includes a processor and a non-transitory computer readable storage medium to store instructions for execution by the processor.

23. The simulation system of claim 17, wherein the synchronizer causes the simulation system to perform a method including
performing an initial transient simulation on a plurality of circuit blocks of an integrated circuit over an initial predetermined period of time up to an envelope start time;
performing a local truncation error check of harmonics used in envelope simulation on results of the initial transient simulation;
determining a number of cycles of a cyclic waveform that can be skipped during envelope simulation in response to the local truncation error check;
performing envelope simulation of a first radio-frequency circuit block from the envelope start time to an envelope end time such that a number of sample points and clock cycles are skipped;
trigonometrically interpolating results of the envelope simulation to determine a solution of skipped sample points for the first RF circuit block within the skipped clock cycles; and
providing the solution of the skipped sample points for the first RF circuit block to other circuit blocks and simulating the other circuit blocks at a synchronization time point in response to the solution to synchronize the simulation of the plurality of circuit blocks of the integrated circuit.

24. The simulation system of claim 23, wherein the synchronizer further causes the simulation system to perform the method including
trigonometrically interpolating the results of the envelope simulation to obtain a solution for input and output signals of the first RF circuit block at the synchronization time; and checking smoothness of the input signals at all input ports of the first RF circuit block to validate the envelope simulation.

25. The simulation system of claim 24, wherein
if the smoothness checking indicated that the envelope simulation is invalid at the synchronization time, the synchronizer further causes the simulation system to perform the method including trigonometrically interpolating the results of the envelope simulation at a time prior to the synchronization time and performing transient simulation in the first RF circuit block from the prior time to the synchronization time, accepting the solution of the transient simulation at the synchronization time, and continuing the transient simulation in the first RF circuit block until signal transients are settled in the first RF circuit block.

26. The simulation system of claim 24, wherein
the synchronizer causes the simulation system to repeatedly perform the elements of the method for each and every RF circuit block of the integrated circuit.

27. The simulation system of claim 17, wherein
at least one of the non-RF blocks is a digital circuit block.

28. The simulation system of claim 17, further comprising:
a waveform database in communication with the transient analysis engine and the envelope analysis engine, the waveform database to store output waveforms for the integrated circuit.

29. The simulation system of claim 28, wherein
the performance of envelope simulations of the RF blocks by the envelope analysis engine generates output waveforms for the RF blocks; and the waveform database further stores the output waveforms for the RF blocks.

* * * * *